(12) United States Patent
Shirakawa et al.

(10) Patent No.: US 8,487,343 B2
(45) Date of Patent: Jul. 16, 2013

(54) SEMICONDUCTOR DEVICE, SEMICONDUCTOR INTEGRATED CIRCUIT DEVICE FOR USE OF DRIVING PLASMA DISPLAY WITH USING SAME, AND PLASMA DISPLAY APPARATUS

(75) Inventors: Shinji Shirakawa, Moriya (JP); Junichi Sakano, Hitachi (JP); Kenji Hara, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 349 days.

(21) Appl. No.: 12/825,839

(22) Filed: Jun. 29, 2010

(65) Prior Publication Data

US 2010/0327315 A1 Dec. 30, 2010

(30) Foreign Application Priority Data

Jun. 30, 2009 (JP) ................................. 2009-154524

(51) Int. Cl.
*H01L 29/739* (2006.01)

(52) U.S. Cl.
USPC ............. 257/141; 257/E29.197; 257/E21.382

(58) Field of Classification Search
USPC .......... 257/565, 557, 575, E27.023, E27.032, 257/E27.043, 139, 141, E29.197, E21.382
See application file for complete search history.

(56) References Cited

U.S. PATENT DOCUMENTS

| | | | | |
|---|---|---|---|---|
| 5,432,370 A | * | 7/1995 | Kitamura et al. | 257/339 |
| 5,559,348 A | * | 9/1996 | Watabe et al. | 257/141 |
| 5,654,561 A | * | 8/1997 | Watabe | 257/139 |
| 6,049,104 A | * | 4/2000 | Hshieh et al. | 257/328 |
| 6,064,086 A | * | 5/2000 | Nakagawa et al. | 257/335 |
| 6,137,140 A | * | 10/2000 | Efland et al. | 257/343 |
| 6,274,904 B1 | * | 8/2001 | Tihanyi | 257/329 |
| 6,713,794 B2 | * | 3/2004 | Suzuki | 257/288 |
| 7,719,086 B2 | * | 5/2010 | Ikuta et al. | 257/556 |
| 7,737,523 B2 | * | 6/2010 | Kikuchi et al. | 257/484 |
| 7,825,430 B2 | * | 11/2010 | Terashima | 257/140 |
| 7,829,955 B2 | * | 11/2010 | Hatade | 257/370 |
| 7,948,058 B2 | * | 5/2011 | Hara et al. | 257/557 |
| 7,999,317 B2 | * | 8/2011 | Lu et al. | 257/342 |
| 2002/0005559 A1 | * | 1/2002 | Suzuki | 257/492 |
| 2004/0262696 A1 | * | 12/2004 | Ronsisvalle | 257/378 |
| 2005/0012121 A1 | * | 1/2005 | Tihanyi et al. | 257/256 |
| 2006/0273400 A1 | * | 12/2006 | Arai et al. | 257/368 |
| 2008/0135972 A1 | * | 6/2008 | Ikuta et al. | 257/492 |

(Continued)

FOREIGN PATENT DOCUMENTS

JP 2008-270377 6/2008

*Primary Examiner* — David Vu
*Assistant Examiner* — Earl Taylor
(74) *Attorney, Agent, or Firm* — Antonelli, Terry, Stout & Kraus, LLP.

(57) ABSTRACT

A horizontal-type IGBT having a large current density, which is formed on a SOI substrate, has an emitter region, which is made up with two (2) or more of base-layers of a second conductivity-type on an oxide film groove, wherein the base-layers of the second conductivity-type in the emitter region are covered with a layer of a first conductivity-type, being high in the conductivity than a drift layer, and length of a gate electrode on the oxide film groove is reduced than the length of the gate electrode on the collector, and further the high-density layer of the first conductivity-type is formed below the base layer of the second conductivity-type on the collector, thereby achieving the high density of the layer of the first conductivity-type while maintaining an endurable voltage, and an increase of the current density.

11 Claims, 5 Drawing Sheets

U.S. PATENT DOCUMENTS

| | | | |
|---|---|---|---|
| 2008/0265278 A1* | 10/2008 | Hara et al. ................... | 257/141 |
| 2009/0315072 A1* | 12/2009 | Shirakawa et al. ........... | 257/139 |
| 2010/0327314 A1* | 12/2010 | Huang et al. ................. | 257/139 |
| 2010/0327315 A1* | 12/2010 | Shirakawa et al. ........... | 257/139 |
| 2011/0081751 A1* | 4/2011 | Ikuta et al. ................... | 438/135 |
| 2011/0227147 A1* | 9/2011 | Li et al. ........................ | 257/329 |
| 2011/0241109 A1* | 10/2011 | Vashchenko .................. | 257/337 |
| 2011/0272735 A1* | 11/2011 | Schmidt ........................ | 257/139 |

\* cited by examiner

SEMICONDUCTOR DEVICE, SEMICONDUCTOR INTEGRATED CIRCUIT DEVICE FOR USE OF DRIVING PLASMA DISPLAY WITH USING SAME, AND PLASMA DISPLAY APPARATUS

This application relates to and claims priority from Japanese Patent Application No. 2009-154242 filed on Jun. 30, 2009, the entire disclosure of which is incorporated herein by reference.

BACKGROUND OF THE INVENTION

The present invention relates to an insulation gate bipolar transistor (hereinafter, being described "IGBT") of lateral-type, a semiconductor integrated circuit device for use of driving a plasma display with using the same, and a plasma display apparatus.

In recent years, due to the feature of having a small region for separating devices and being free from parasitic transistor, developments have being made on a high-voltage power IC with using a SOI substrate, vigorously. The high-voltage power IC, into which the present invention is mainly applied, is a semiconductor IC for use of driving a plasma display, and the endurable voltage is 200V in the class thereof. In the developments of the high-voltage power IC, it is said to be necessary to improve an output feature or characteristic of the high-voltage output device for driving a load, directly, from a viewpoint of an improvement of the characteristic and reduction of a chip size. However, with a lateral-type IGBT, which is mainly applied as an output device for a power IC using the SOI substrate, for the purpose of forming an emitter/gate region and a collector region on the same plane, an area is reduce, which can be substantially conductive, i.e., a current capacity per the area of an element becomes small. Also, with the lateral-type IGBT, since a current component is large in the lateral direction of the element, a latch up can be generated, easily; there is a problem that an area or region is narrow for operating the element with stability. By taking this problem into the consideration, developments are made on the lateral-type IGBT that can increase the current capacity per a unit area and has a wide safe operating region. In this regard, the present inventors previously filed the invention for achieving a high outputting of the lateral-type IGBT, in Japanese Patent Laying-Open No. 2008-270377 [Patent Document 1].

The lateral-type IGBT of [Patent Document 1] has such structures as is shown in FIG. 2. In FIG. 2, an n-type semiconductor substrate 101 is disposed on a buried oxide layer 116 which is formed on a Si substrate 117. In this FIG. 2, on a surface layer of an n-type semiconductor substrate 101 is selectively formed a p-base region 102, and in a part of the surface layer of that p-base region 102 are formed two (2) pieces of n-emitter regions 104, where a p-contact region 103 is formed between those two (2) pieces of n-emitter regions 104, partially duplicating on the n-emitter regions 104. On a surface exposing portion of the n-type semiconductor substrate 101, on which no p-base region 102 is formed, a n-buffer region 109 is formed, selectively, and on a surface layer of that n-buffer region 109 is formed a p-collector region 110. And, on a surface of a channel region 114 on the surface layer of the p-base region 102 is provided a gate electrode 106, which is connected with a G terminal (e.g., a gate terminal) through a gate oxide film 105. Also, an emitter electrode 107 is provided, contacting on the surfaces of the n-emitter region 104 and the p-contact region 103 in common, and a collector electrode 111 is provided on the surface of the p-collector region 110, and they are connected with an E terminal (e.g., an emitter terminal) and a C terminal (e.g., a collector terminal), respectively. This structure corresponds to a right-half portion of the lateral-type IGBT obtainable by folding back in a plane of symmetry. The structure of FIG. 2 is characterized in that an n-layer 118, which is higher in the density than the n-type semiconductor 101, is formed to cover a p-base region at a central portion of the element. In the IGBT according to the invention of [Patent Document 1], due to a fact that a silicon layer between the first conductivity type layer 118 of high density, which covers the added emitter region mentioned above, and a buried oxide 116, is lowered in the resistance, current can also flow into the emitter/gate region separating from the collector region, but without increasing voltage drop therein, and thereby increasing the current density thereof, comparing to the conventional structure. However, within the IGBT having such the structure as shown in FIG. 2, since the breakdown voltage e goes down, abruptly, when the density of n-type impurity of the high-density n-layer 118, covering the p-base region at the central portion of the element, exceeds a certain value of density, there is a limit in an increase of the current density with an aid of the high density.

PRIOR ART DOCUMENTS

Patent Documents

[Patent Document 1] Japanese Patent Laying-Open No. 2008-270377 (2008).

BRIEF SUMMARY OF THE INVENTION

However, with the IGBT having such structure as shown in FIG. 2 mentioned above, since the breakdown voltage goes down, abruptly, when the density of n-type impurity of the high-density n-layer 118, covering the p-base region at the central portion of the element, exceeds the certain value of density, there is a limit in an increase of the current density with an aid of the high density.

For dissolving such the problem as mentioned above, according to the present invention, there is provided a semiconductor device, comprising: an oxide film, which is provided in a part of a main surface on one side of a semiconductor substrate of a first conductivity-type; a base region of a second conductivity-type including an emitter region of the first conductivity-type, which are selectively formed on a surface layer of a region, which is separated with insulation, being surrounded by an oxide film groove provided on said semiconductor substrate of the first conductivity-type; a gate electrode, which is formed on a base region between said semiconductor substrate of the first conductivity-type and the emitter region of the first conductivity-type; and a collector region of the first conductivity-type, wherein two or more regions of the second conductivity type exist within said emitter region of the first conductivity-type putting said collector region of the second conductivity-type therebetween, said collector region of the second conductivity-type is disposed at a central portion of a region surrounded by the oxide film groove, and said emitter region of the first conductivity-type is disposed on side of said oxide film groove, and wherein said region of the first conductivity-type higher in the density than said semiconductor substrate of the first conductivity-type is provided between said base regions of the second conductivity-type and below said base region of the second conductivity-type, and the gate electrode on side of said oxide film groove is shorter than the gate electrode on said collector side.

Further, according to the present invention, the semiconductor device as described in the above, wherein said region of the first conductivity-type higher in the density than said semiconductor substrate of the first conductivity-type existing between said base regions of the second conductivity-type and below said base region of the second conductivity-type is not in contact on a side of said oxide film groove.

Further, according to the present invention, the semiconductor device as described in the above, wherein the said region of the first conductivity-type higher in the density than said semiconductor substrate of the first conductivity-type existing between said base regions of the second conductivity-type and below said base region of the second conductivity-type does not exist below said gate electrode on a side of said oxide film groove.

Further, according to the present invention, the semiconductor device as described in the above, wherein a number of channels defined between the oxide film grooves surrounding the region from said collector is three (3).

Further, according to the present invention, there is provided a plasma display comprising the semiconductor device described in the above.

Further, according to the present invention, there is provided a plasma display apparatus comprising the semiconductor integrated circuit device for use of driving a plasma display described in the above.

Also, for dissolving the problems mentioned above, according to the present invention, there is also provided a semiconductor device, comprising: an oxide film, which is provided in a part of a main surface on one side of a semiconductor substrate of a first conductivity-type; a base region of a second conductivity-type including an emitter region of the first conductivity-type, which are selectively formed on a surface layer of a region, which is separated with insulation, being surrounded by an oxide film groove provided on said semiconductor substrate of the first conductivity-type; a gate electrode, which is formed on a base region between said semiconductor substrate of the first conductivity-type and the emitter region of the first conductivity-type; and a collector region of the first conductivity-type, wherein two or more regions of the second conductivity type exist within said emitter region of the first conductivity-type putting said collector region of the second conductivity-type therebetween, said collector region of the second conductivity-type is disposed at a central portion of a region surrounded by the oxide film groove, and said emitter region of the first conductivity-type is disposed on side of said oxide film groove, and wherein said region of the first conductivity-type higher in the density than said semiconductor substrate of the first conductivity-type is provided only between said base regions of the second conductivity-type and below said base region of the second conductivity-type.

Further, according to the present invention, the semiconductor device as described in the above, further comprises a gate electrode on a side of said oxide film groove, being shorter than the gate electrode on the side of said collector.

Further, according to the present invention, the semiconductor device as described in the above, wherein said region of the first conductivity-type higher in the density than said semiconductor substrate of the first conductivity-type existing between said base regions of the second conductivity-type and below said base region of the second conductivity-type does not exist below said gate electrode on a side of said oxide film groove.

Further, according to the present invention, the semiconductor device as described in the above, wherein a number of channels defined between the oxide film grooves surrounding the region from said collector is three (3).

Further, according to the present invention, there is provided a semiconductor integrated circuit device for use of driving a plasma display comprising the semiconductor device described in the above.

Further, according to the present invention, there is provided a plasma display apparatus comprising the semiconductor integrated circuit device for use of driving a plasma display described in the above.

According to the present invention, since there is provided no high-density n-layer between the side of the oxide film groove and the p-base regions on the side of the oxide film groove, when applying voltage on the collector, gradually, comparing to the IGBT of the conventional structure shown in FIG. 2, the depletion layer generating from the p-base region under low collector voltage contacts with the depletion layer on the surface of the buried oxide film. After that contact mentioned above, with an increase of the collector voltage, since almost of it is shared by a drift region defined between the emitter and the collector, then it is possible to reduce an increase of electric fields within the p-region and a n-region surrounding it.

With the structure, according to the present invention, it is possible to achieve high density of the n-type impurity of the high-density n-layer holding the endurable voltage, and thereby improving the output current density thereof. In addition thereto, since the size from the side of the oxide film groove up to the p-base region can be shorten, it is possible to make an area of the element small in the size thereof.

According to the present invention, it is possible to achieve of building up a semiconductor device for use of driving a plasma display, which necessitates high breakdown-voltage/large current, by increasing the current density of the lateral-type IGBT, and also by achieving small-sizing thereof, with smaller chip size, and further it is possible to achieve small-sizing of a semiconductor integrated circuit device for use of driving the plasma display and a plasma display apparatus, with applying the same therein.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE PREFERRED EMBODIMENTS

Hereinafter, embodiments according to the present invention will be fully explained by referring to the attached drawings.

Figure 1:
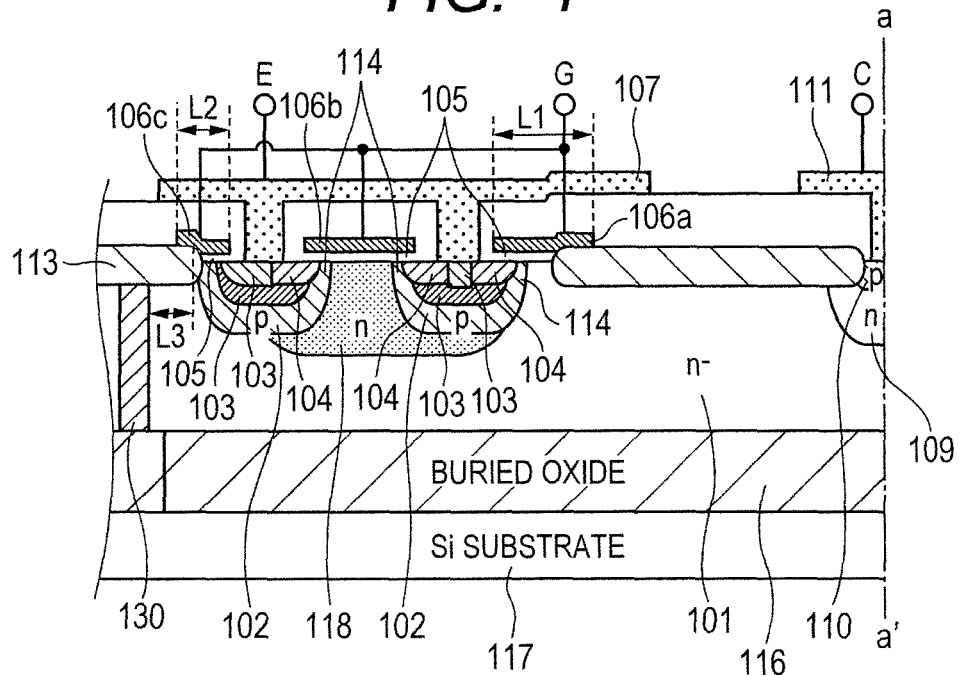
FIG. 1 is a cross-section structural view for showing a semiconductor device, according to a first embodiment of the present invention.

FIG. 1 is a partial cross-section structure view for showing IGBT, according to an embodiment of the present invention. In this FIG. 1, a-a shows a plane of symmetry, and this FIG. 1 shows a left-half surface of the IGBT. FIG. 1 shows the IGBT of 200V class of the breakdown voltage, and hereinafter, explanation will be given about the structures thereof.

In FIG. 1, an n-type semiconductor substrate 101 is disposed on a buried oxide layer 116 which is formed on a Si substrate 117. In FIG. 1, in a part of a surface layer of a region, which is divided or separated with insulation, with enclosing a separation oxide film 113 provided on a part of a main surface of a n-type semiconductor substrate 101, and an oxide film groove 130, there are formed two (2) or more pieces of p-base regions 102, selectively. In a part of the surface layer of each of those p-base regions 102 is formed an n-type emitter region 104, and between those n-emitter regions 104 is formed a p-contact region 103. Also, in a surface exposing portion of an n-type substrate 1, in which the p-base region 102 is not formed, there is formed an n-buffer region 109, selectively, and on a surface layer of that n-buffer is formed a p-collector region 110. And, on the surface of a channel region 114 on the surface layer of the p-base region 102 is formed a gate electrode 106, which should be connected to a G terminal through a gate oxide film 105. Also, an emitter electrode 107 is provided, connecting on the surfaces of the n-emitter region 104 and the p-contact region 103 in common, and a collector electrode 111 is provided on the surface of the p-collector 110, and wherein they are connected with an E electrode and a C electrode, respectively. And, an n-layer 118, being high density comparing to the n-type semiconductor substrate 101, is formed between the p-base region 102s and below the p-base region 102 on the collector side. Further, the two (2) or more pieces of p-base regions mentioned above are disposed on the side of oxide film groove 130, and the n-buffer region 109 mentioned above and the p-collector region 110 mentioned above are disposed in a center of a region surrounded or enclosed by the oxide film groove 130, in the structure shown therein. Also, the structure shown in FIG. 1 has a separation oxide film 113 between the p-base region 102 and the oxide film groove 130. However, this separation oxide film 113 and the gate electrode 106c have a function of mitigating electric fields in a periphery of the p-base region 102 on the side of the oxide film groove 130. Also, length L2 of the gate electrode 106c on the side of the oxide film groove 130 is shorter than length L1 of the gate electrode 106a on the collector side.

Figure 2:
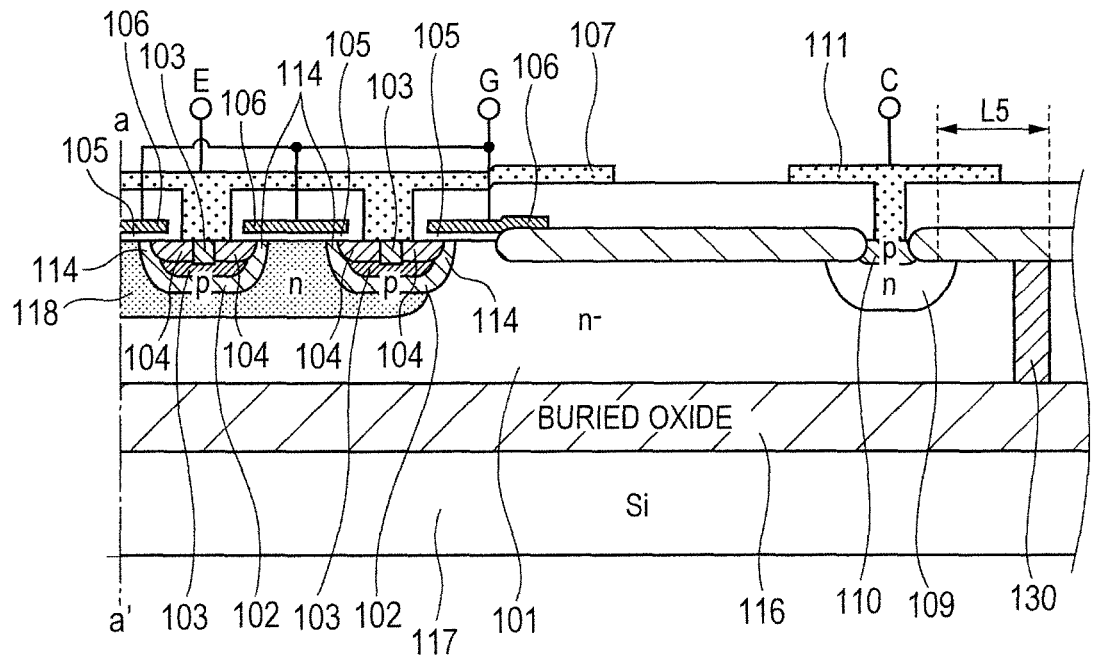
FIG. 2 is a cross-section structural view for showing a semiconductor device, according to the conventional art.
Figure 4:
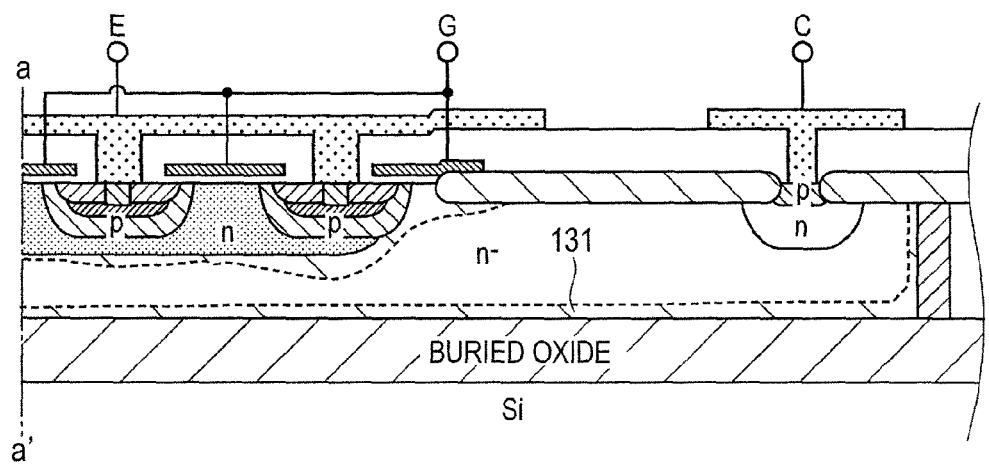
FIG. 4 is a view for showing a cross-section structure of the semiconductor device according to the conventional art, and in particular, for showing a depletion layer of an n-region when applying a positive potential to a collector.
Figure 5:
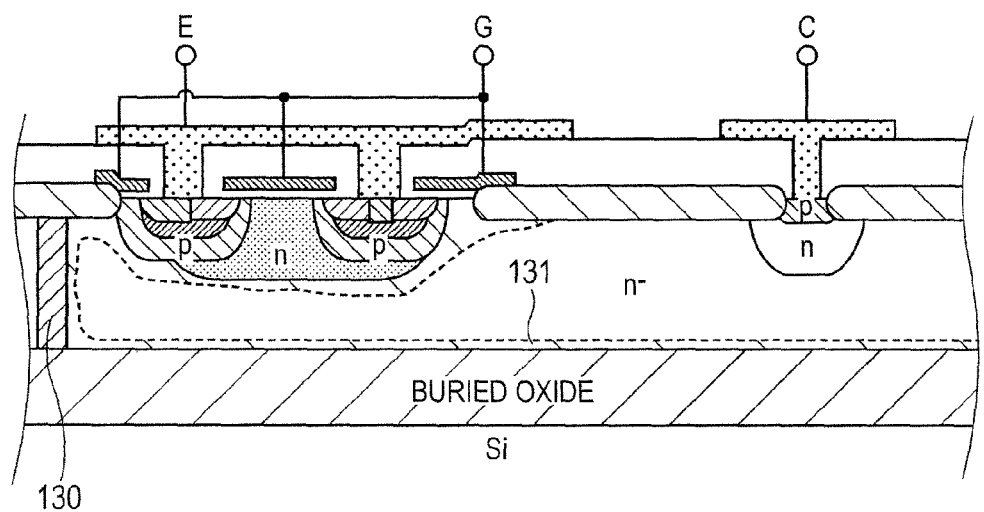
FIG. 5 is a view for showing a cross-section structure of the semiconductor device according to the present invention, and in particular, for showing a depletion layer of an n-region when applying a positive potential to a collector.
Figure 6:
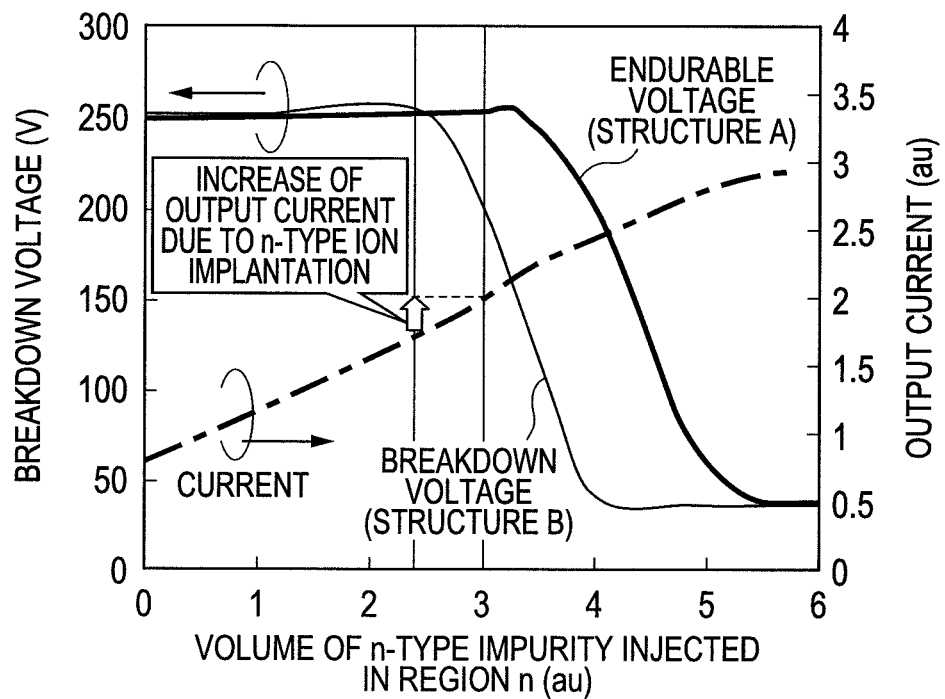
FIG. 6 is a view for showing a relationship between an endurable voltage and a quantity of output current of a linear region, with respect to a douse volume injected into a high-density n-layer.

Next, explanation will be given on the reason why the high density of the high-density n-layer 118 can be obtained while keeping the breakdown voltage, according to the present invention. FIG. 4 is a cross-section view for showing a depletion layer 131 expanding in an n-region surrounding the p-base region 102 when applying relatively low positive voltage on the collector, comparing to that in the conventional structure shown in FIG. 2. If increasing the collector voltage from the condition shown in FIG. 4, the depletion layer expands from the side of the p-base region 102 to the side of a buried oxide film, and when it makes contact with the depletion layer on a surface of the buried oxide film, then an increase of the collector voltage thereafter is almost shared by an n-type silicon region laying between the p-base region 102 and the p-region 110 on the collector side. Since an increase of electric field is small in the p-base region 102 and the n-regions surrounding that, the endurable voltage cannot be determined by the n-regions by p-base region 102 and the n-regions surrounding that, but the endurable voltage is determined by the voltage, at which an avalanche generated by strong electric field in the periphery of the n-buffer region. On the contrary to that, if increasing the density of the high-density n-layer 118, expansion of the depletion layer 131 is suppressed, the avalanche generates at relatively low collector voltage due to the strong electric field in the vicinity of a boundary between the p-base region 102 and the n-type semiconductor substrate 101 before it makes contact with the surface of the depletion layer on the buried oxide film mentioned above, and that is the reason why there is a limit in the increase of the density of the high-density n-layer 118. Explanation will be given on the reason why the present invention shown in FIG. 1 is able to suppress the lowering of the endurable voltage, for such the problem as mentioned above, with reference to FIG. 5. This FIG. 5 is a view for showing the depletion layer 131 expanding in the n-region when applying the relatively low voltage onto the collector in the structure shown in FIG. 1. With the structure shown in FIG. 5, the high-density n-layer 118 is formed below the p-base region 102 below the n-region between the p-base regions 102 and the p-base region 102 on the collector side. Also, because of the reason, which will be mentioned later, the gate electrode 106c is shorter than the gate electrode 106a, and thereby shortening length L3 between the p-base region 102 and the oxide film groove 130. If applying voltage onto the collector in the structure shown in FIG. 1, since there in no high-density n-layer 118, and since the space between the p-base region 102 and the oxide film groove 130 is narrow, then as is shown in FIG. 5, the depletion region expanding from the p-base region directing to the oxide film groove 130 is connected with the depletion layer on the surface of the oxide film with the collector voltage lower than that of FIG. 4. Next, explanation will be given on shortening of the length L2 of the gate electrode 106c and the length L3 between the p-base region 102 and the oxide film groove 130. With the conventional structure shown in FIG. 2, since the electric field is weak at the channel far from the collector, contribution of the output current is small comparing to the other channels. This is also same with the structure of disposing the n-base region 102 shown in FIG. 1 on the side of the oxide film groove 130, and with the present structure, the contribution of the output current is smallest, flowing from the channel formed below the gate electrode, which is nearest to the oxide film groove 130. On the other hand, for the purpose of brining the channel formed below the gate electrode, which is nearest to the oxide film groove 130 mentioned above, to operate in the similar manner to that of the other channels, there is a necessity of bringing the gate electrode 106c to be same to the gate electrode 106a. However, in case where the portion below the gate electrode 106c has no function as the channel, there is no necessity of the high-density n-layer 118 in the space between the p-base region 102 mentioned above and the oxide film groove 130; this brings the depletion layer to expand, easily, from the p-base region 102 directing to the oxide film groove 130, and as a result, there is an advantage of enabling high density of the high-density n-layer 118. Also, since the roll of the gate electrode 106c is only to mitigate the electric field, it is possible to shorten the length L2 of the gate electrode 106c comparing to the length L1 of the gate electrode 106a, and also to shorten the length L3 between the p-base region 102 and the oxide film groove 130, as well, it is possible to extend the depletion layer from the p-base region 102 to the oxide film groove 130 with voltage much lower. In addition thereto, reduction of the distance L3 between the p-base region 102 and the oxide film groove 130 can also contribute to reduction of an area of the element. Further, explanation will be given about shortening of the length between the p-base region 102 and the oxide film groove 130. When applying voltage onto the collector with the structure shown in FIG. 2, since almost of the voltage is applied between the collector and the oxide film groove, the endurable voltage is lowered down there if shortening the distance L5 between the collector and the oxide film groove in FIG. 2; however, with the structure shown in FIG. 1, the voltage applied between the p-base region 2 and the oxide film groove 130 is smaller comparing to the voltage applied between the collector and the oxide film groove in FIG. 2, then it is possible to shorten the distance between the p-base region 102 and the oxide film groove 130. But, for the purpose of protecting the breakdown voltage from being lowered due to an increase of voltage in the vicinity of the boundary between the p-base region 102 and the n-type semiconductor substrate 101, the gate electrode 106c for mitigating the electric field is necessary, and in such case, it is preferable to form the gate electrode in the shape extending from an upper part of the thin gate oxide film 105 to the thick oxide film 113. Next, explanation will be given on an increase of output current characteristics of the IGBT according to the present invention, by referring to FIG. 6. This FIG. 6 is a view for showing the contents mentioned above, i.e., a relationship between the breakdown voltage and a quantity of output current of a linear region with respect to the douse volume, which is injected into the high-density n-layer 118. The structure A is the structure according to the present invention shown in FIG. 1, and the structure B is that, in case when a number of channels is three (3), being same to that of the structure A in FIG. 2. From this FIG. 6, in the structure A, as a result of brining the depletion layer to contact with the surface of the buried oxide film from the side of the p-base region 102 with the low collector voltage mentioned above, the quantity of the n-type impurity, which can maintain the breakdown voltage with stability, is larger than that of the structure B, for that reason, it can be seen that the density of the high-density n-layer 118 can be increased within such a region that the breakdown voltage can be maintained, and thereby enlarging the output current. With an increase of density of the output current in this lateral-type IGBT, it is possible to achieve a semiconductor integrated circuit for use of driving the plasma display necessitating the high endurable voltage/large current, constructed with smaller chip sizes.

Figure 3:
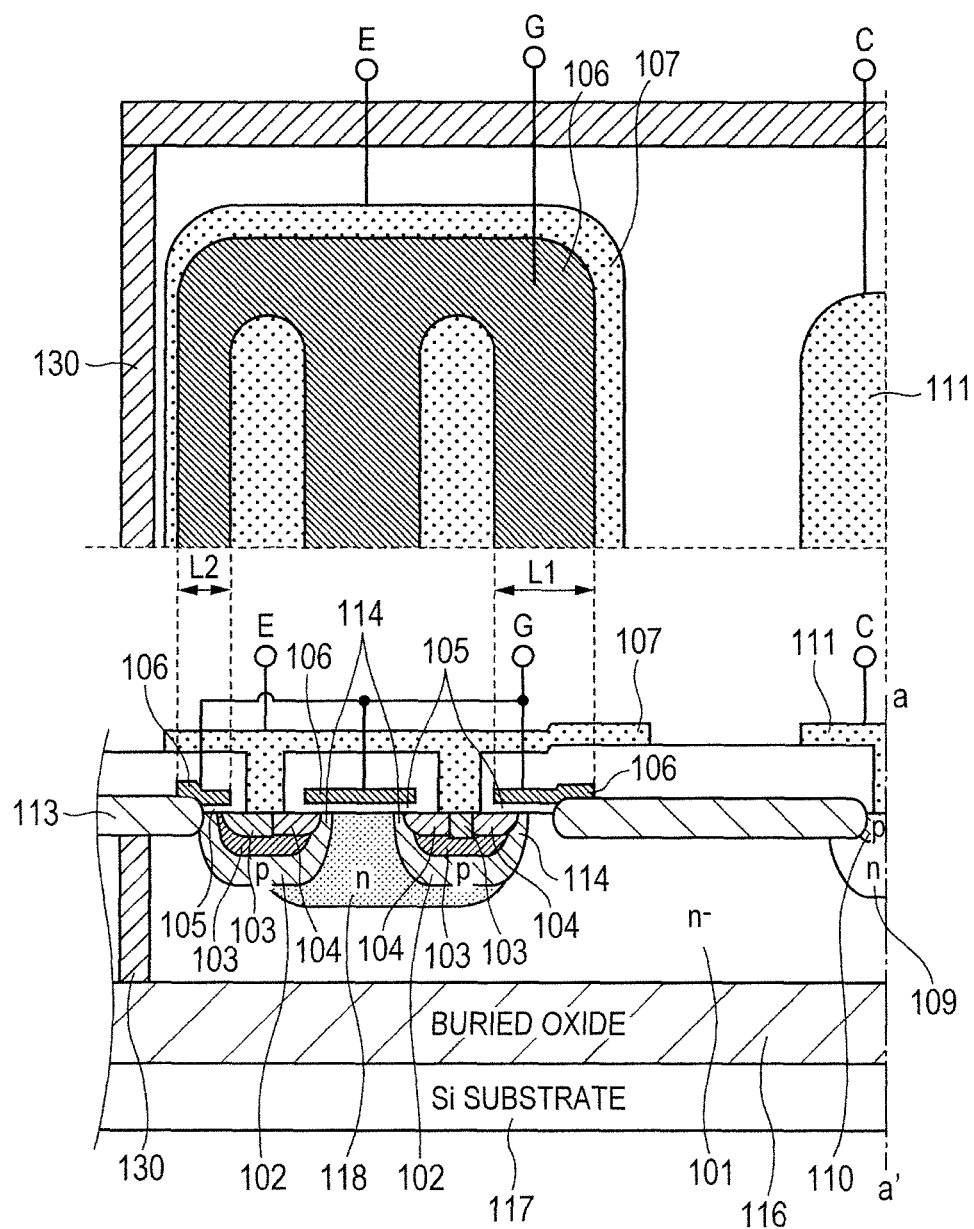
FIG. 3 is a view for showing a cross-section structure, according to the present invention, and an electrode configuration when a gate electrode is combined with in one body.

FIG. 3 is a view for showing the configuration of the electrodes in case where the gate electrodes are combined with in one body, in the cross-section structure shown in FIG. 1. In FIG. 1, the gate electrodes are shown by the reference numerals 106a, 106b and 106c, separately; however, in FIG. 3, they are constructed in one body as is shown in the figure.

In this case, as is shown in FIG. 3, the configuration of the gate electrode is characterized in that the length L2 of the gate electrode on the side of the oxide film groove 130 is shorter than the length L1 of the gate electrode on the collector side, i.e., in asymmetric configuration.

Also, in the above, the explanation was given on the deletion of the area of the element with an aid of shortening the distance between the p-base region 102 and the oxide film groove 130. According to the present invention, since it is presumption to increase the output current by means of the high-density n-layer 118, the p-base regions are formed by two (2) pieces or more than that on the side of the oxide film groove 130; however, according to the present invention, the area of the emitter region, in which the p-base regions are aligned, comes to be large if forming the p-base regions by three (3) pieces of more than that, and thereby a ratio of deleing the area by shortening the distance between the p-base region 102 and the oxide film groove 130 is lowered down. For this reason, for reducing the area of the element, effectively, the number of the p-base regions formed on the side of the oxide film groove 130 is limited to two (2), no channel is formed below the gate element, which is nearest to the side of the oxide film groove 130, due to the reason mentioned above, and the number of the channel regions is three (3), in the structure shown herein.

Figure 7:
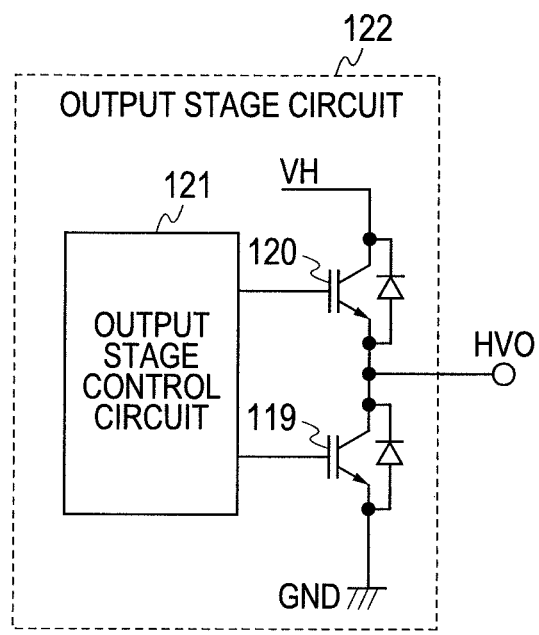
FIG. 7 shows the structure of circuitry at an output stage of a semiconductor integrated circuit device for use of driving a plasma display, applying therein the semiconductor device according to the present invention.

FIG. 7 shows an example of the structure of a circuit at an output stage of the semiconductor integrated circuit device for use of driving the plasma display, into which the lateral-type IGBT according to the present invention are applied. The output stage circuit 122 has the construction that the IGBTs 119 and 120, according to the present invention, are connected between an electric power source VH and GND, in a manner of the totem-pole, wherein a connecting point between the IGBTs is conducted to an output terminal HVO. ON/OFF of the IGBTs 119 and 120 are controlled by an output stage control circuit 121, and thereby bringing the output terminal HVO into a voltage level, i.e., VH, GND or a high impedance condition.

Figure 8:
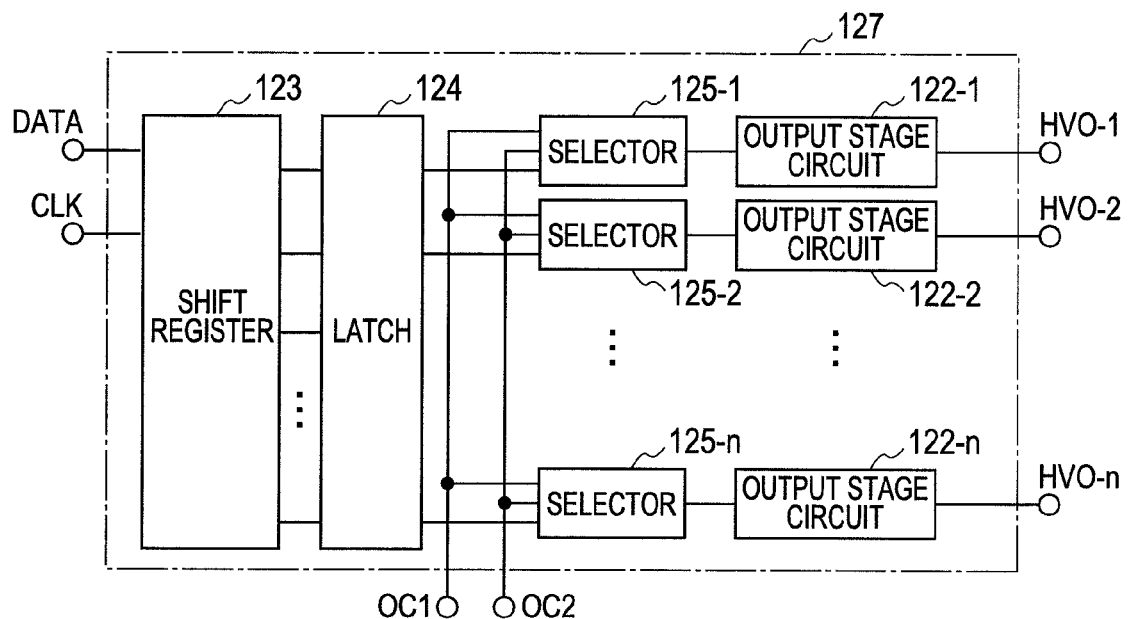
FIG. 8 shows an example of the structure of the semiconductor integrated circuit device for use of driving the plasma display, applying therein the semiconductor device according to the present invention.

FIG. 8 shows an example of the structure of the semiconductor circuit device for use of driving the plasma display, into which the lateral-type IGBTs, according to the present invention are applied. A semiconductor circuit device for use of driving the plasma display 127 is constructed with a shift register circuit 123, a latch circuit 124, a selector circuit 125, and an output stage circuit 122. In the shift register circuit, a control signal inputted from a terminal DATA is shifted in synchronism with a clock signal inputted into a terminal CLK. Also, depending on a combination of with a terminal 001 or 002, to be connected with the selector, all output terminals are turned into the VH level, the GND voltage level, the high impedance condition, or a condition outputting data from the latch.

Figure 9:
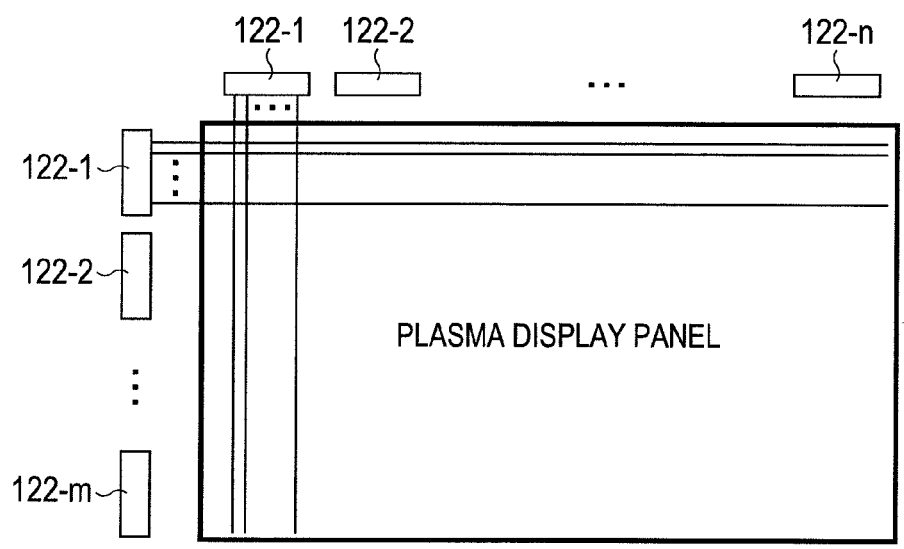
FIG. 9 shows an example of the structure of the semiconductor integrated circuit device for use of driving the plasma display, applying therein the semiconductor device according to the present invention.

FIG. 9 shows an example of the structure of a plasma display apparatus applying the semiconductor integrated circuit for use of driving the plasma display, with using the semiconductor device according to the present invention. With applying such circuit structure as shown in FIG. 8, it is possible to control a light emission portion of the plasma display apparatus. According to the semiconductor integrated circuit device, according to the present invention, it is possible to reduce costs of the plasma display apparatus.

The present invention is applicable into a semiconductor device necessitating high voltage/large current, and a semiconductor integrated circuit device for use of driving the plasma display, and a plasma display apparatus.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A semiconductor device, comprising:
a semiconductor substrate of a first conductivity-type having a main surface on one side of said semiconductor substrate;
an oxide film, which is provided in a part of said main surface of the semiconductor substrate;
a separated region, being provided in said main surface of said semiconductor substrate and separated with insulation from other regions in said main surface of said semiconductor substrate, is surrounded by an oxide film groove provided in the semiconductor substrate of the first conductivity-type;
two or more base regions of a second conductivity-type including an emitter region of the first conductivity-type, which are selectively formed in a surface region of said main surface within said separated region;
a gate electrode, which is formed on the base regions between said semiconductor substrate of the first conductivity-type and the emitter region of the first conductivity-type; and
a collector region of the second conductivity-type, wherein
said two or more base regions of the second conductivity-type put said collector region of the second conductivity-type therebetween,
said collector region of the second conductivity-type is disposed at a central portion of the separated region surrounded by the oxide film groove, and said emitter region of the first conductivity-type is disposed on a side of said oxide film groove,
the gate electrode on a side of said oxide film groove is shorter than the gate electrode on said collector side, and wherein
a high-density region of the first conductivity-type which is higher in density than said semiconductor substrate of the first conductivity-type is provided between said base regions of the second conductivity-type and below said base regions of the second conductivity-type, and does not exist below said gate electrode on the side of said oxide film groove.

2. The semiconductor device, as described in the claim 1, wherein
said high-density region of the first conductivity-type which is higher in density than said semiconductor substrate of the first conductivity-type and exists between said base regions of the second conductivity-type and below said base region of the second conductivity-type is not in contact with said oxide film groove.

3. The semiconductor device, as described in the claim 2, wherein a number of channels defined between the oxide film groove surrounding the separated region and said collector region is three.

4. A semiconductor integrated circuit device for use of driving a plasma display comprising the semiconductor device described in the claim 3.

5. A plasma display apparatus comprising the semiconductor integrated circuit device for use of driving a plasma display described in the claim 4.

6. A semiconductor device, comprising:
A semiconductor substrate of a first conductivity-type having a main surface on one side of said semiconductor substrate;
an oxide film, which is provided in a part of said main surface of the semiconductor substrate;
a separated region, being provided in said main surface of said semiconductor substrate and separated with insulation from other regions in said main surface of said semiconductor substrate, is surrounded by an oxide film groove provided in said semiconductor substrate of the first conductivity type;
two or more base regions of a second conductivity-type including an emitter region of the first conductivity-type, which are selectively formed in a surface region of said main surface within said separated region;
a gate electrode, which is formed on the base regions between said semiconductor substrate of the first conductivity-type and the emitter region of the first conductivity-type; and
a collector region of the second conductivity-type, wherein
said two or more base regions of the second conductivity-type put said collector region of the second conductivity-type therebetween,
said collector region of the second conductivity-type is disposed at a central portion of the separated region surrounded by the oxide film groove, and said emitter region of the first conductivity-type is disposed on a side of said oxide film groove, and wherein
a high-density region of the first conductivity-type higher in density than said semiconductor substrate of the first conductivity-type is provided only between said base regions of the second conductivity-type and below said base region of the second conductivity-type, and does not exist between said oxide film groove and the base region of the second conductivity-type on the side of said oxide film groove.

7. The semiconductor device, as described in the claim 6, further comprising:
the gate-electrode on the side of said oxide film groove, being shorter than the gate electrode on a side of said collector region.

8. The semiconductor device, as described in the claim 7, wherein
said high-density region of the first conductivity-type higher in the density than said semiconductor substrate of the first conductivity-type existing between said base regions of the second conductivity-type and below said base region of the second conductivity-type does not exist below said gate electrode on the side of said oxide film groove.

9. The semiconductor device, as described in the claim 8, wherein a number of channels defined between the oxide film grooves surrounding the separated region and said collector region is three.

10. A semiconductor integrated circuit device for use of driving a plasma display comprising the semiconductor device described in the claim 9.

11. A plasma display apparatus comprising the semiconductor integrated circuit device for use of driving a plasma display described in the claim 10.

* * * * *